United States Patent [19]
Kawabata

[11] Patent Number: 5,409,258
[45] Date of Patent: Apr. 25, 1995

[54] FAULT DIAGNOSIS APPARATUS FOR CONTROL CIRCUIT OF VEHICLE PASSENGER PROTECTING DEVICE

[75] Inventor: Munehiro Kawabata, Hyogo, Japan

[73] Assignee: Mitsubishi Denki Kabushiki Kaisha, Tokyo, Japan

[21] Appl. No.: 182,234

[22] Filed: Jan. 18, 1994

[30] Foreign Application Priority Data

Apr. 27, 1993 [JP] Japan ................ 5-101141

[51] Int. Cl.$^6$ ............................................ B60R 21/32
[52] U.S. Cl. ........................ 280/735; 364/424.03; 340/436; 371/25.1
[58] Field of Search ............... 280/728 R, 734, 735; 180/282; 340/436, 438; 307/10.1; 364/424.03; 371/25.1

[56] References Cited

U.S. PATENT DOCUMENTS

| | | | |
|---|---|---|---|
| 3,633,016 | 1/1972 | Walker et al. ............ | 371/25.1 |
| 3,818,431 | 6/1974 | Hosaka ..................... | 340/436 |
| 5,112,080 | 5/1992 | Okano ....................... | 307/10.1 |
| 5,166,880 | 11/1992 | Furui ......................... | 280/735 |
| 5,182,459 | 1/1993 | Okano et al. ............ | 340/438 |
| 5,283,472 | 2/1974 | Takeuchi .................. | 280/735 |

FOREIGN PATENT DOCUMENTS

| | | |
|---|---|---|
| 316854 | 1/1991 | Japan . |
| 773414 | 10/1991 | Japan . |
| 3238359 | 10/1991 | Japan . |
| 4252759 | 9/1992 | Japan . |

Primary Examiner—Karin L. Tyson

[57] ABSTRACT

A fault diagnosis apparatus for diagnosing a control circuit comprising a squib that activates an air bag or the like, a first and a second switching element for activating the squib, and a collision judging circuit that turns on the first and the second switching elements upon detecting an impact in excess of a predetermined level. A microcomputer included in the apparatus generates a signal that turns on either of the two switching elements. The voltage between the activated switching element and the squib is then detected and compared by the microcomputer with the voltage in normal operation for fault diagnosis.

5 Claims, 4 Drawing Sheets

FAULT DIAGNOSIS APPARATUS FOR CONTROL CIRCUIT OF VEHICLE PASSENGER PROTECTING DEVICE

BACKGROUND OF THE INVENTION:

1. Field of the Invention

The present invention relates to a fault diagnosis apparatus for diagnosing a vehicle passenger protecting device such as an air bag mounted on the vehicle.

2. Description of the Prior Art

FIG. 1 is a block diagram of a prior art control circuit of a vehicle passenger protecting device as disclosed in Japanese Patent Laid-Open No. HEI/3-238359. This control circuit controls the ignition of a squib 6 that actuates illustratively an air bag, not shown. The squib 6 is an example of the means for activating the vehicle passenger protecting device such as the air bag. In FIG. 1, reference numeral 20 represents collision detecting means comprising a first acceleration sensor 1, a second acceleration sensor 2 and a collision judging circuit 3. The first and the second acceleration sensors 1 and 2 detect the acceleration of the vehicle, and the collision judging circuit 3, implemented illustratively as a microcomputer, checks to see if the vehicle has collided. Reference numeral 4 stands for a NAND circuit that outputs the inverted logical product of an output a from the collision judging circuit 3 and the output from a delay circuit 9. Reference numeral 7 denotes an AND circuit that outputs the logical product of an output b from the collision judging circuit 3 and the output from the delay circuit 9.

Reference numeral 5 is a PNP transistor whose base is connected to the output of the NAND circuit 4; 8 is an NPN transistor 8 whose base is connected to the output of the AND circuit 7. A power supply 11, the PNP transistor 5, the squib 6, the NPN transistor 8 and ground are connected in cascade connection. A capacitor, not shown, for accumulating electrical energy is furnished interposingly between the power supply 11 and the PNP transistor 5.

In operation, the first and the second acceleration sensors 1 and 2 detect the acceleration of the vehicle and supply the collision judging circuit 3 thereof. The collision judging circuit 3 integrates the acceleration from the first acceleration sensor 1 and regards the result as a first integral value. If the first integral value exceeds a first threshold value, the collision judging circuit 3 brings its output a to the high level. The collision judging circuit 3 also integrates the acceleration from the second acceleration sensor 2 and regards the result as a second integral value. If the second integral value exceeds a second threshold value, the output b is brought to the high level. If the difference between the first integral value and the first threshold value is within a predetermined range and if the difference between the second integral value and the second threshold value is also within a predetermined range, the collision judging circuit 3 brings its output c to the high level. The first and the second threshold values correspond to the integral values at which the air bag must be inflated. The predetermined ranges are those that are free from the effects of noises.

The output c is delayed for a certain period of time by the delay circuit 9. When the output a and the output from the delay circuit 9 are at the high level, the NAND circuit 4 brings its output to the low level to turn on the PNP transistor 5. When the output b and the output from the delay circuit 9 are at the high level, the AND circuit 7 brings its output to the high level to turn on the NPN transistor 8. This causes the capacitor to supply its energy to the squib 1 for ignition.

The role of the delay circuit 9 is to prevent malfunction in case of a runaway of the collision judging circuit 3. That is, the operation of the collision judging circuit 3 is monitored at intervals each shorter than the delay time of the delay circuit 9. If any operational fault is detected, the collision judging circuit 3 is reset. As a result, the outputs a through c are brought to the low level to keep the squib 1 from igniting. The monitoring circuit is not included in FIG. 1.

High levels of reliability are required of the control circuit for the air bag or other vehicle passenger protecting devices.. Besides the monitoring by the collision judging circuit 3, the attempts to meet the strict reliability requirement include various measures including one disclosed in Japanese Patent Laid-Open No. HEI/3-16854. The disclosure involves allowing small currents to flow through a transistor arrangement while the squib 1 is being monitored for the voltage it develops. When the voltage exceeds a predetermined range, a fault is considered to have occurred. The setup comprises a current flow control portion and a voltage detecting circuit. The current flow control portion feeds the transistor arrangement with small currents at predetermined intervals.

One disadvantage of the above prior art is that the current flow control portion and the voltage detecting circuit needed for fault diagnosis tend to complicate the circuit structure. The fact that the current flow control portion further requires a current limiting circuit makes the circuit structure even more complicated. In addition, there is a possibility that the air bag can be inflated inadvertently despite the limits applied to the current flowing through the transistors 5 and 8.

SUMMARY OF THE INVENTION

It is therefore an object of the present invention to overcome the above and other deficiencies and disadvantages of the prior art and to provide a fault diagnosis apparatus for diagnosing the control circuit of a vehicle passenger protecting device such as an air bag, the apparatus being simply constructed to diagnose accurately the switching means of the control circuit, whereby the possibility of the air bag being inflated accidentally will be eliminated.

In carrying out the invention and according to one aspect thereof, there is provided a fault diagnosis apparatus for diagnosing a control circuit producing signals for alternately turning on the first and the second switching means. The output potential of the respective switching means in effect upon output of the signals is then compared witch a known output potential of the same switching means in effect in normal operation. If the difference between the two potentials fails to fall within a predetermined range, the control circuit is judged to be faulty.

In the inventive apparatus, the first and the second switching means are activated alternately upon fault diagnosis. Because both means never conduct simultaneously, there is no possibility of the air bag getting inflated accidentally. Since there is no need for a current limiting circuit, the circuit structure is simplified.

These and other objects, features and advantages of the invention will become more apparent upon a read-

DETAILED DESCRIPTION OF THE PREFERRED EMBODIMENT

Figure 1:
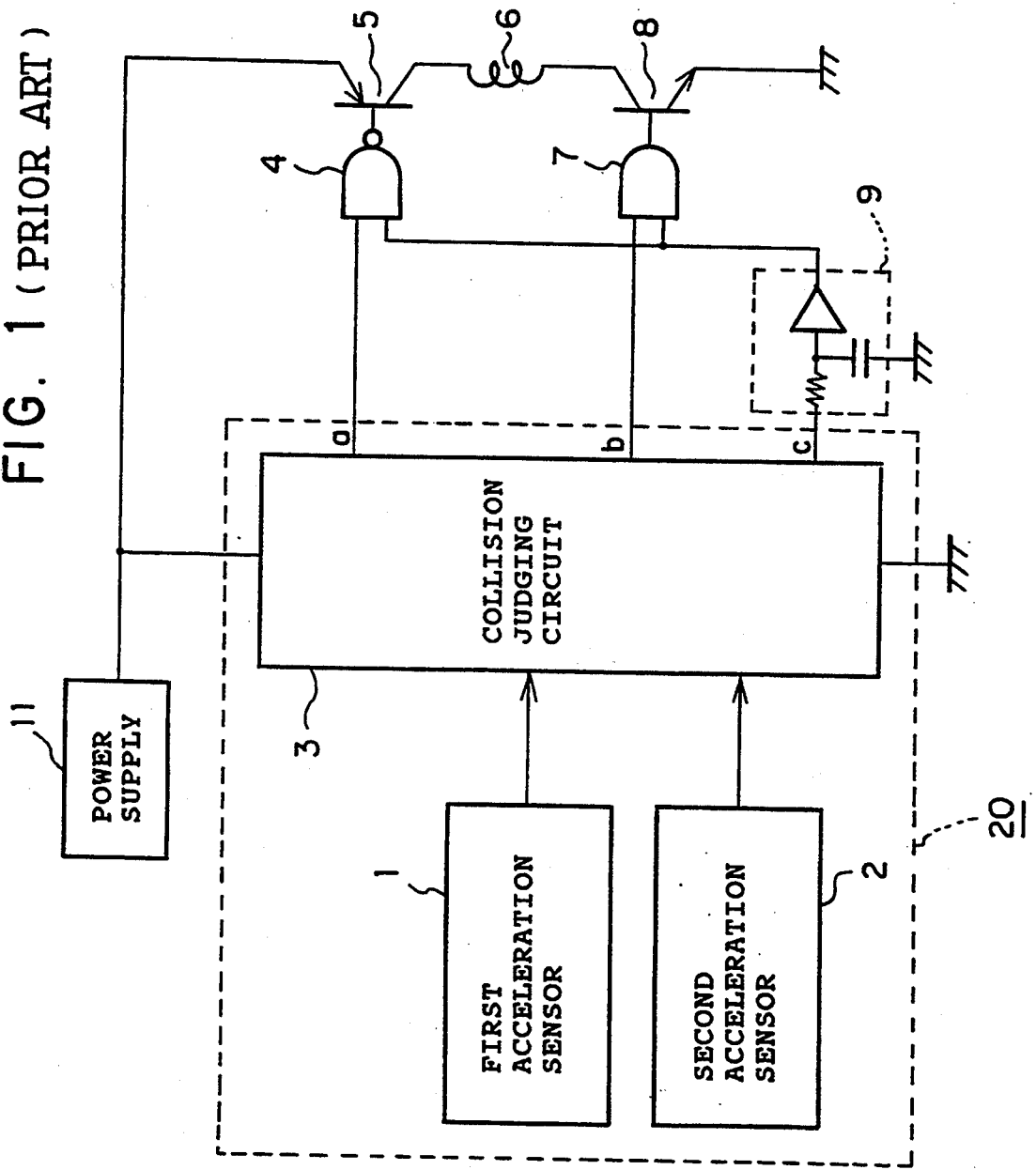
FIG. 1 is a block diagram of a prior art fault diagnosis apparatus for diagnosing the control circuit of a vehicle passenger protecting device.
Figure 2:
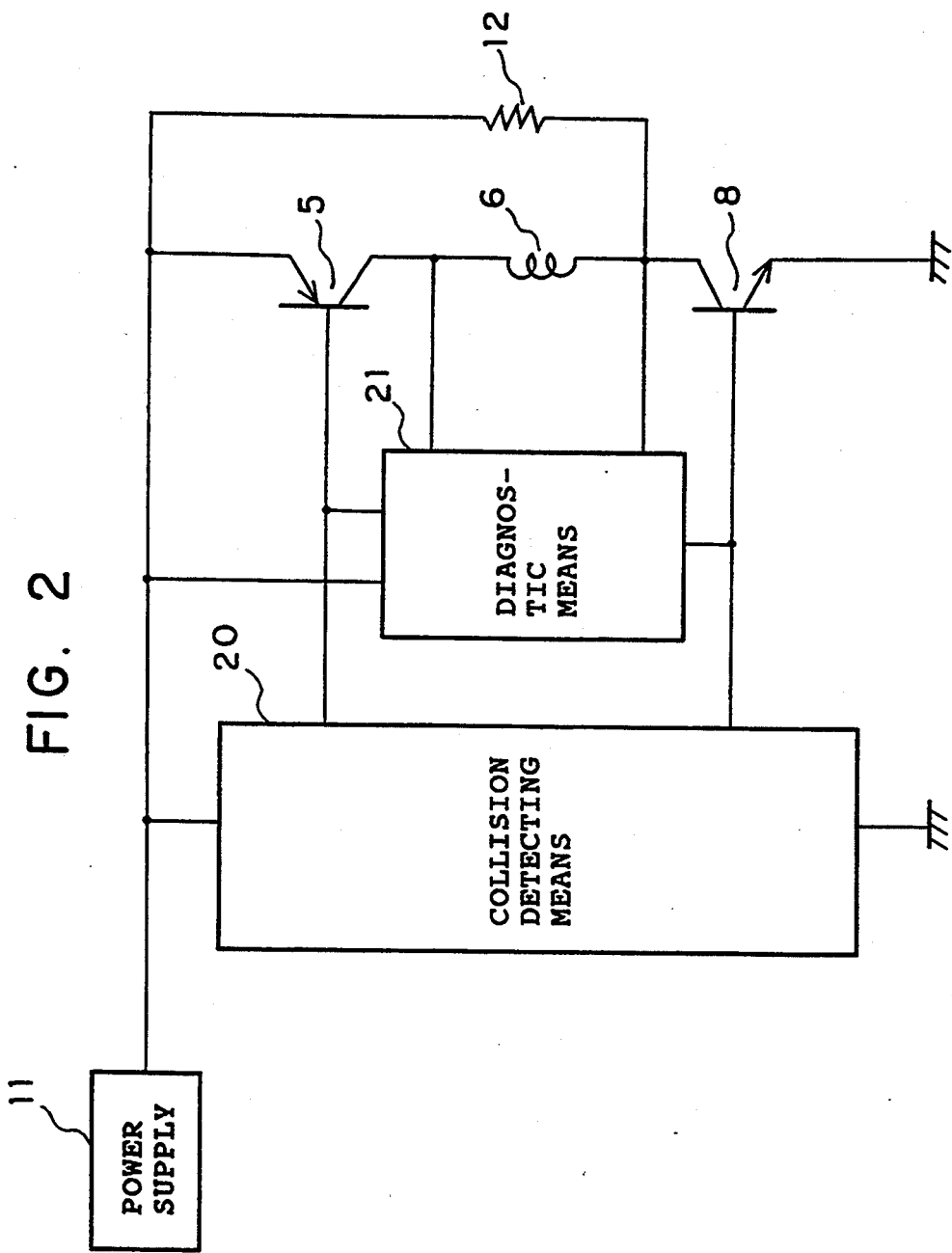
FIG. 2 is a block diagram of a fault diagnosis apparatus for diagnosing a vehicle passenger protecting device control circuit, the apparatus being practiced as a preferred embodiment of the invention.

FIG. 2 is a block diagram of a fault diagnosis apparatus practiced as the preferred embodiment of the invention for diagnosing a vehicle passenger protecting device control circuit. In FIG. 2, reference numeral 20 indicates collision detecting means structured illustratively as shown in FIG. 1. Reference numeral 21 denotes diagnostic means.

Figure 3:
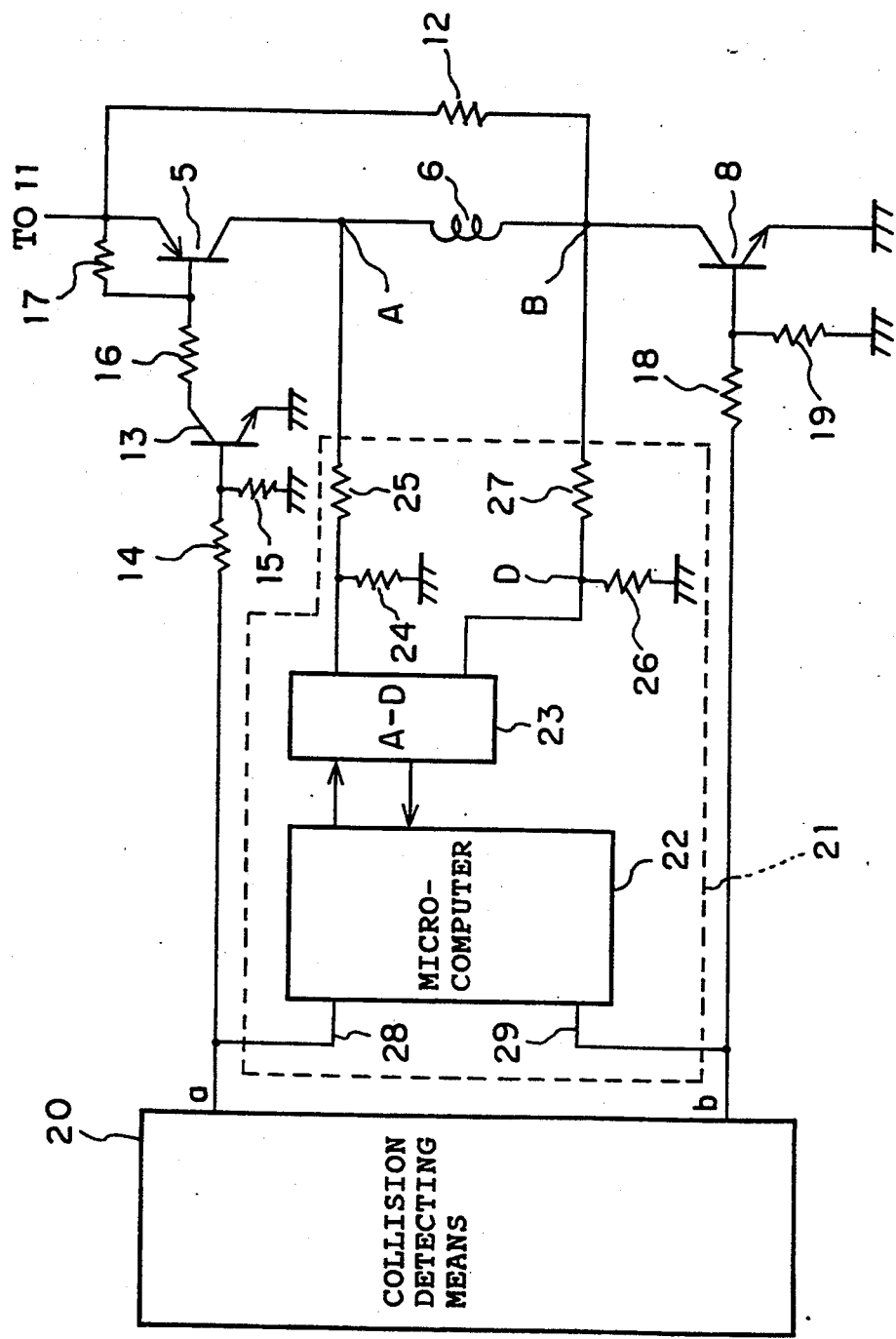
FIG. 3 is a detailed block diagram of diagnostic means included in the embodiment.

FIG. 3 is a block diagram of an example of the diagnostic means 21 included in FIG. 2. As shown in FIG. 3, the diagnostic means 21 comprises a microcomputer 22, an analog-digital converter 23, and resistors 24, 25, 26 and 27. The microcomputer 22 has output ports 28 and 29 connected respectively to outputs a and b of the collision detecting means 20 and is used to carry out fault diagnosis. The analog-digital converter 23 converts voltages at predetermined points of measurement A and B from analog to digital values, and supplies the microcomputer 22 with the digital voltage values. The resistors 24 and 25 divide the voltage at the point A, and the resistors 26 and 27 divide the voltage at the point B. A resistor 12 is connected in parallel with a series circuit composed of a first transistor 5 and the squib 6.

Reference numeral 13 is a small-signal transistor for driving the first transistor 5 (e.g., PNP transistor); 14 and 15 are resistors for driving the small-signal transistor 13; 16 and 17 are resistors for driving the first transistor 5; 18 and 19 are resistors for driving a second transistor 8. The small-signal transistor 13 and the resistors 14 through 17 constitute a driving circuit of the first transistor 5, and the resistors 18 and 19 make up a driving circuit of the second transistor 8. The small-signal transistors 13 and the resistors 14 through 19, though contained in the setup of FIG. 2, are not shown therein for the visual ease of comprehension.

In operation, suppose that the collision detecting means 20 has the same structure as that of FIG. 1. In that case, the first and the second acceleration sensors 1 and 2 detect the acceleration of the vehicle and feeds the collision judging circuit 3 therewith. The collision judging circuit 3 integrates the acceleration from the first acceleration sensor 1 and regards the result as a first integral value. If the first integral value exceeds a first threshold value, the collision judging circuit 3 brings its output a to the high level to conduct the transistor 13. This causes the first transistor 5 to conduct. The collision judging circuit 3 also integrates the acceleration from the second acceleration sensor 2 and regards the result as a second integral value. If the second integral value exceeds a second threshold value, the collision judging circuit 3 brings its output b to the high level to conduct the second transistor 8. This supplies electrical energy to the squib 6 which acts to inflate the air bag. This setup may include a delay circuit, a NAND circuit and an AND circuit to prevent the malfunction of the collision judging circuit 3, as is conventionally the case. The structure of the collision detecting means 20 is not limited to that of FIG. 1.

Figure 4:
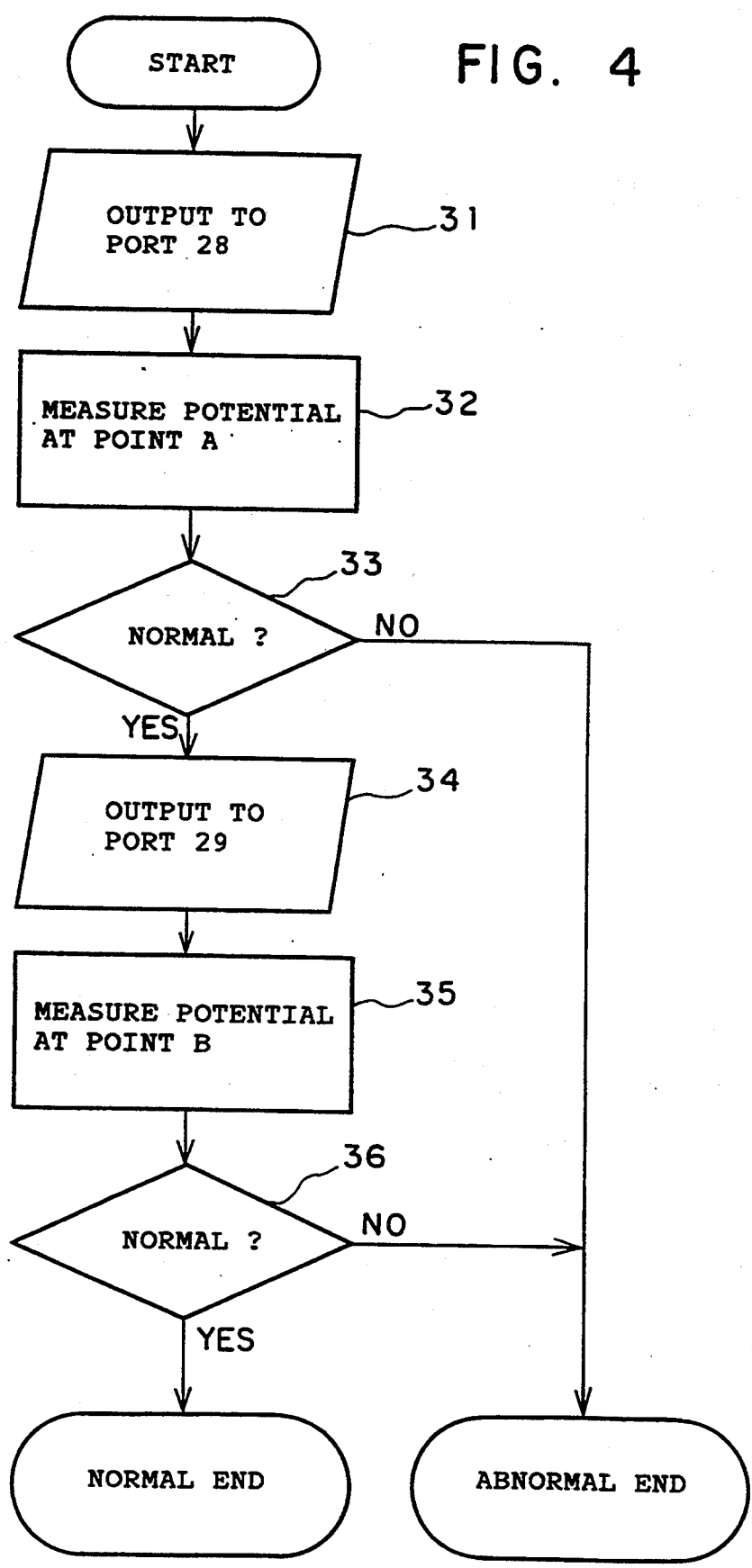
FIG. 4 is a flowchart of steps in which a microcomputer constituting the diagnostic means operates.

How fault diagnosis is performed will now be described with reference to the flowchart of FIG. 4. Before the first and the second transistors 5 and 8 are conducted, the potentials at the points A and B are detected to ascertain that the first and the second transistors 5 and 8 are not short-circuited. If the first transistor 5 is short-circuited, the potential at the point A is equal to the supply voltage. If the second transistor 8 is short-circuited, the potential at the point B is equal to the ground potential. The method of potential detection will be described later in more detail. After verifying that the first and the second transistors 5 and 8 are not short-circuited, the microcomputer 22 starts carrying out the steps in FIG. 4.

The microcomputer 22 first brings its output port 28 to the high level to conduct the first transistor 5 (step 31). If the first transistor 5 and the driving circuit associated therewith are normal, the potential at the point A, i.e., the point of connection between the collector of the first transistor 5 and the squib 6, becomes equal to the voltage of the power supply 11. In practice, however, a forward voltage drop Vsce between collector and emitter of the first transistor 5 makes the potential at the point A slightly lower than the supply voltage. The voltage at the point A is divided by the resistors 24 and 25, the divided voltage being input to the analog-digital converter 23. In other words, the resistors 24 and 25 serve to bring the potential at the point A into the operating range of the analog-digital converter 23.

If any one of the first transistor 5 and the components of the driving circuit for that transistor is faulty, the potential at the point A becomes equal to the potential at the point B divided by the sum of three resistance values: of the squib 6 and resistors 25 and 24. The potential at the point B is determined by the supply voltage as well as by the resistance values of the resistors 12 and 24 through 27. The microcomputer 22 measures the potential at the point A via the resistor 24 (step 32), and checks to see if the measured potential is normal (step 33). If the potential measured at the point A is not equal to the supply voltage (more specifically, the voltage value that takes Vsce into consideration), the microcomputer 22 recognizes a fault.

The microcomputer 22 then places its output port 28 in the high impedance state and brings its output port 29 to the high level to conduct the second transistor 8 (step 34). If the second transistor 8 and the driving circuit associated therewith are normal, the potential at the point B, i.e., the point of connection between the collector of the second transistor 8 and the squib 6, becomes equal to the ground potential. In practice, however, a forward voltage drop Vsce between collector and emitter of the second transistor 8 makes the potential at the point B slightly higher than the ground potential. The voltage at the point B is divided by the resistors 26 and 27, the divided voltage being input to the analog-digital converter 23. That is, the resistors 26 and 27 act to bring the potential at the point B into the operating range of the analog-digital converter 23.

If any one of the second transistor 8 and the components of the driving circuit for that transistor is faulty, the potential at the point B is determined by the supply voltage as well as by the resistance values of the resistors 12 and 24 through 27. The microcomputer 22 measures the potential at the point B via the resistor 26 (step 35), and checks to see if the measured potential is normal (step 36). If the potential measured at the point B is not equal the ground potential (more specifically, the voltage value that takes Vsce into consideration), the microcomputer 22 recognizes a fault. In that case, the microcomputer 22 places the output port 29 in the high impedance state and terminates fault diagnosis.

The first and the second transistors 5 and 8 as well as their driving circuits are diagnosed in the manner described above. Because the first and the second transistors 5 and 8 never conduct simultaneously, there is no possibility of the air bag getting inflated accidentally.

In the above-described embodiment, the resistor 12 is connected in parallel with the series circuit composed of the first transistor 5 and the squib 6. Alternatively, the resistor 12 may be removed to let a point D, i.e., the point of connection between the resistors 26 and 27, connect to the power supply 11 via a pull-up resistor 31. Another alternative is to remove the resistor 12 so that the ground-side potential of the resistors 24 and 26 falls between the supply voltage and the ground potential.

In the above embodiment, the transistors 5 and 8 are made of a bipolar transistor each. Alternatively, FET's may constitute the transistors 5 and 8. Although the embodiment has been described in connection with the air bag, the invention may also be applied to other kinds of vehicle passenger protecting devices such as a seat belt pre-tensioner (a device designed to enhance the tension of the seat belt upon impact of the vehicle to better protect the passenger).

As many apparently different embodiments of this invention may be made without departing from the spirit and scope thereof, it is to be understood that the invention is not limited to the specific embodiments thereof except as defined in the appended claims.

What is claimed is:

1. A fault diagnosis apparatus for diagnosing a control circuit comprising activating means for activating a vehicle passenger protecting device, first and second switching means for placing said activating means in operating state, and collision detecting means for turning on both said first and said second switching means upon detecting an impact in excess of a predetermined level, said fault diagnosis apparatus including:

diagnostic means for diagnosing said control circuit for fault by outputting signals for alternately turning on said first and said second switching means, and by comparing the output potential of the respective switching means upon output of said signals with a known output potential of the same switching means in normal operation.

2. A fault diagnosis apparatus according to claim 1, wherein said control circuit includes a power supply and ground; said power supply, said first switching means, said activating means, said second switching means and said ground of said control circuit being connected in series;

said diagnostic means of said fault diagnosis apparatus detecting the potential of the point of connection between said first switching means and said activating means upon output of the signal for turning on said first switching means, and detecting the potential of the point of connection between said second switching means and said activating means upon output of the signal for turning on said second switching means.

3. A fault diagnosis apparatus according to claim 2, further comprising a resistance connected in parallel with a serial circuit composed of said first switching means and said activating means.

4. A fault diagnosis apparatus according to claim 3, wherein said diagnostic means judges any one of the switching means to be faulty if the detected potential is different from the potential in normal operation.

5. A fault diagnosis apparatus according to claim 4, wherein said diagnostic means comprises:

an analog-digital converter for converting the value of the detected potential to a digital value; and a microcomputer for outputting the signal for turning on any one of the switching means and carrying out fault diagnosis by use of the detected potential value received from said analog-digital converter.

* * * * *